United States Patent [19]

Utaka

[11] Patent Number: 4,829,535
[45] Date of Patent: May 9, 1989

[54] VARIABLE WAVELENGTH SEMICONDUCTOR LASER

[75] Inventor: Katsuyuki Utaka, Musashino, Japan

[73] Assignee: Kokusai Denshin Denwa Kabushiki Kaisha, Tokyo, Japan

[21] Appl. No.: 258,777

[22] Filed: Oct. 17, 1988

[30] Foreign Application Priority Data

Oct. 28, 1987 [JP] Japan .................................. 62-270366

[51] Int. Cl.⁴ ............................................... H01S 3/10
[52] U.S. Cl. ........................................ 372/50; 372/20; 372/32; 372/96
[58] Field of Search ....................... 372/20, 32, 50, 45, 372/46, 96

[56] References Cited

U.S. PATENT DOCUMENTS 4,719,636  1/1988  Yamaguchi ........................... 372/20

Primary Examiner—James W. Davie
Attorney, Agent, or Firm—Emmanuel J. Lobato; Robert E. Burns

[57] ABSTRACT

A variable wavelength semiconductor laser is disclosed, in which light emitting regions, waveguide regions and an active filter region including a diffraction grating equipped with a filter function are integrated on a single substrate, whereby only one resonance wavelength is selected to ensure a stable laser operation at a single wavelength of a small oscillation line-width. Further, both light emitting and waveguide regions are disposed on both sides of the active filter region substantially symmetrically with respect thereto, thereby allowing ease in adjusting the refractive indices of the respective regions.

6 Claims, 3 Drawing Sheets

VARIABLE WAVELENGTH SEMICONDUCTOR LASER

BACKGROUND OF THE INVENTION

The present invention relates to a semiconductor laser which is small in oscillation spectral line-width and variable in oscillation wavelength.

By reason of their small size, high efficiency and high reliability, semiconductor lasers have already been put to practical use as the light source for fiber optic communication. Systems heretofore employed utilize the direct modulation capability which is one of outstanding features of the semiconductor laser, and one of such conventional systems is what is called a direct intensity modulation-direct detection (DIM-DD) system in which intensity-modulated light corresponding to the amount of current injected into the semiconductor laser is received directly by a photodiode or avalanche photodiode after being propagated through an optical fiber. A dynamic single wavelength laser which stably operates at a single wavelength even during high-speed modulation, such as a distributed feedback (DFB) semiconductor laser, has been developed for use as the light source in the DIM-DD system, with a view to lessening the influence of dispersion of a single mode fiber so as to increase the repeater spacing.

On the other hand, it is possible to substantially improve the receiving sensitivity and hence increase the repeater spacing more than in the DIM-DD system, by positively utilizing the properties of the wave motion of light, such as its frequency and phase. This system is referred to as a coherent transmission system, which is being given much study experimentally as well as in its theoretical aspect and is now being regarded as a promising future optical communication system (see T. Okoshi, Journal of Lightwave Technology, Vol. LT-2, pp. 341-346, 1984, for example). In the coherent transmission system it is requisite, because of its property, that the light source at the transmitting side and the light source as a local oscillator at the receiving side be small in spectral line-width and variable in oscillation wavelength. In studies made so far on a laboratory scale, intended primarily for evaluating the potential of the system, it is customary to use a gas laser of an extremely small oscillation line width or more practical ordinary semiconductor laser in which an external diffraction grating is provided and light of only a specific wavelength is fed back thereto, thereby achieving high coherence and making the oscillation wavelength tunable. Since the light emitting region of the semiconductor laser is as small as about 1 μm in diameter, however, the laser structure in which the light source and the external diffraction grating are not integrated is readily affected by mechanical vibrations and heat variations, unstable in providing desired characteristics and involves a large-scale system configuration; therefore, it is evident that such a laser structure is not suitable for practical use.

For the reduction of the oscillation line-width it is an effective method to increase the length of a resonator of the laser. In general, however, as the resonator becomes longer, the resonance wavelength spacing also becomes narrower correspondingly, leading to defects of liability to multi-wavelength oscillation and unstability of the narrow line-width characteristic. In addition, wavelength tuning is performed by selecting resonance wavelengths discontinuously, not continuously; accordingly, this semiconductor laser is not suitable for practical use.

SUMMARY OF THE INVENTION

It is therefore an object of the present invention to provide a variable wavelength semiconductor laser of a narrow line-width which is employed as a single wavelength light source.

According to the present invention, light emitting regions, waveguides regions and an active filter region including a diffraction grating equipped with a filter function are integrated on a single substrate, whereby only one resonance wavelength is selected to ensure a stable laser operation at a single wavelength of a small oscillation line-width. Further, both light emitting and waveguide regions are disposed on both sides of the active filter region substantially symmetrically with respect thereto, thereby allowing ease in adjusting the refractive indices of the respective regions.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention clear, an example of prior art will first be described.

Figure 1:
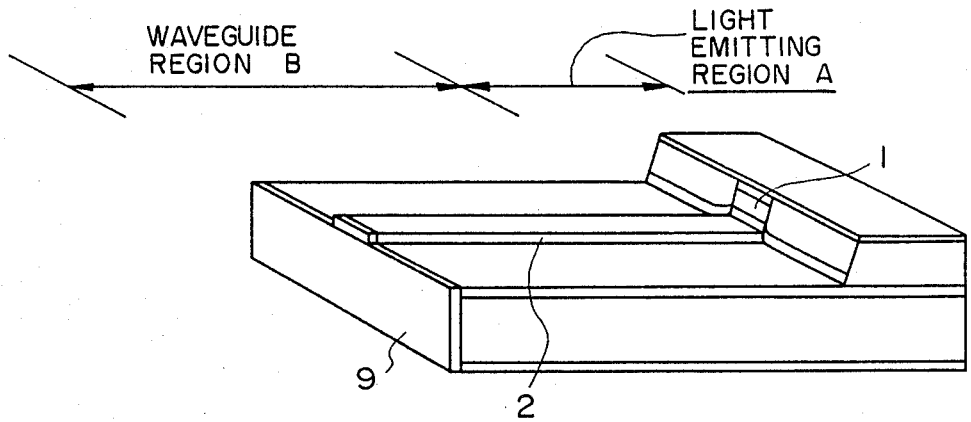
FIG. 1 is a schematic diagram of a conventional semiconductor laser having a long resonator.

A one-piece semiconductor laser in which a waveguide region B is monolithically integrated with a light emitting region A to provide a long resonator structure, as depicted in FIG. 1, has been studied by T. Fujita et al. and it has been reported that a frequency as low as 900 kHz is obtainable with an about 1.8 mm resonator length (Electrocis Letters, Vol. 21, pp. 374-376; 1985). In FIG. 1 reference numeral 1 indicates an InGaAsP light emitting layer, 2 an InGaAsP waveguide layer formed on an extension of the InGaAsP light emitting layer 1, and 9 a metallic film improving the reflection efficiency in a cleavage plane.

However, this example of prior art has a defect described above.

With the accompanying drawings the present invention will hereinafter be described in detail.

(Embodiment 1)

Figure 2:
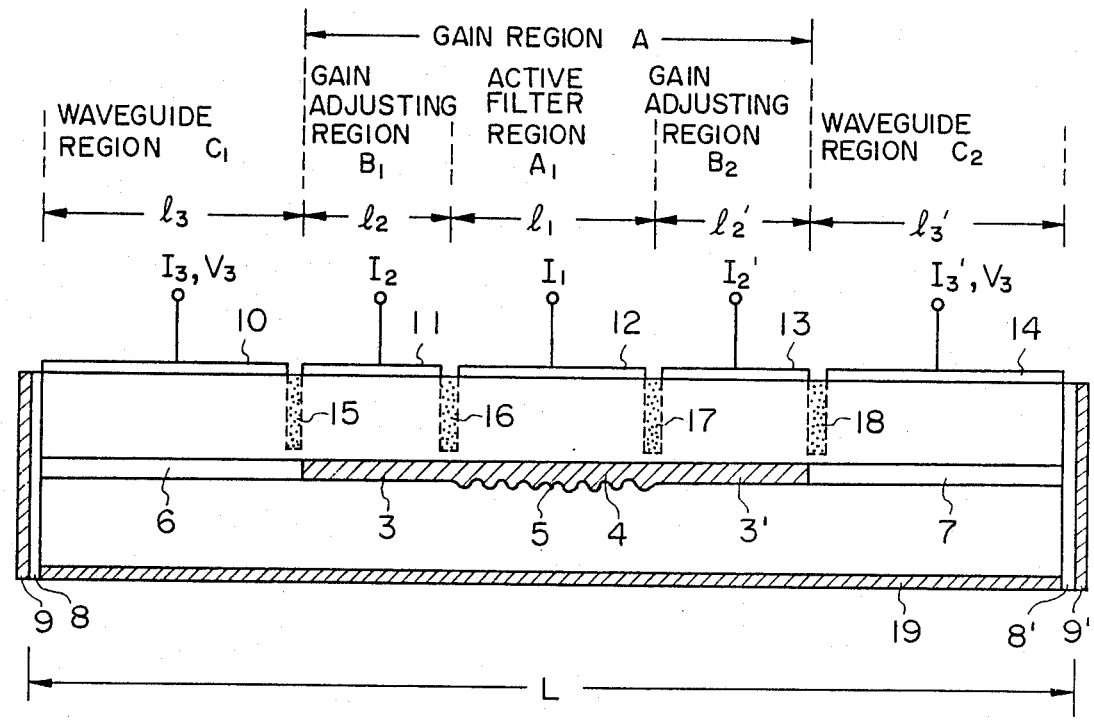
FIG. 2 is a sectional view of a semiconductor laser according to a first embodiment of the present invention.

FIG. 2 illustrates a first embodiment of the present invention. In FIG. 2 reference numerals 3, 3' and 4 indicate light emitting layers of substantially or exactly the same composition, which constitute a gain region A which has an optical gain resulting from injection of a current thereinto. The gain region A comprises three sections, one of which is an active filter region $A_1$ in which a phase shift type diffraction grating 5 having a band-pass filter function is formed along the light emitting layer 4 and the others of which are gain adjusting regions $B_1$ and $B_2$ in which the light emitting layers 3 and 3' are provided. Disposed on both sides of the gain region A are waveguide regions $C_1$ and $C_2$ which have low-loss waveguide layers 6 and 7 coupled thereto with high efficiency, and a pair of reflecting end facets are disposed at opposite ends of the laser assembly. Incidentally, in this embodiment the reflecting end facets are shown to be highly reflective end facets which are formed by metallic films 9 and 9' coated on dielectric films 8 and 8' so as to provide more effective optical confinement. The light emitting layers 3, 3' and 4 and the waveguide layers 6 and 7 are each sandwiched between semiconductor layers of different conductivity types, and the respective regions are provided with electrodes 10, 11, 12, 13 and 14 for independent control thereof. Reference numeral 19 designates a lower electrode, and 15, 16, 17 and 18 high resistance regions for electrical isolation, which can be obtained by implanting proton, for example.

Next, the operation of this embodiment will be described.

Figure 3:
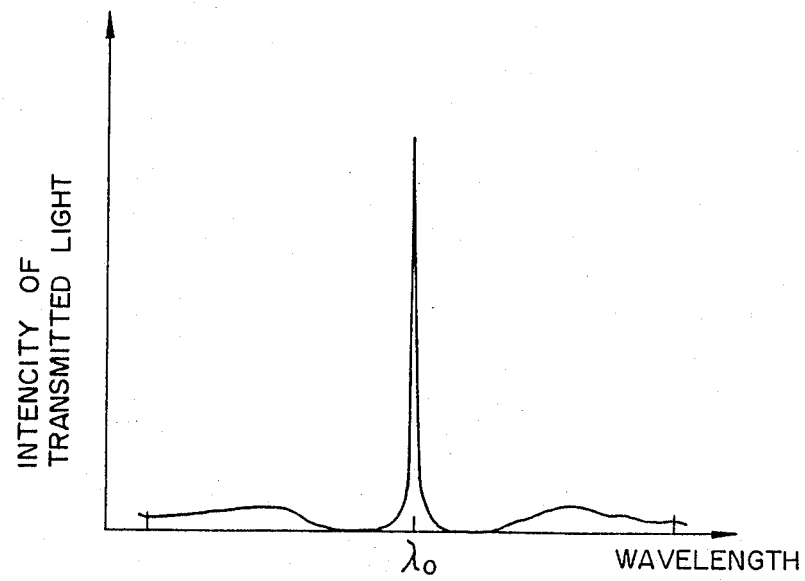
FIG. 3 is a graph showing the transmission spectral characteristic of an active filter having a λ/4 shift diffraction grating for use in the present invention.

In FIG. 3 there is shown a transmission spectral characteristic of the phase shift, for instance, $\lambda/4$ shift diffraction grating 5 in the case where it has a gain. Letting the period and the refractive index of the diffraction grating 5 be represented by $\Lambda$ and $n_2$, respectively, the gain is effectively provided only at the center wavelength given in the form of $\lambda_0 = 2\Lambda n_2$; so that the diffraction grating serves as an active filter which has such a sharp band-pass characteristic as shown in FIG. 3. On the other hand, when an end-facet reflection occurs, the sharp characteristic of the $\lambda/4$ shift diffraction grating 5, such as depicted in FIG. 3, may sometimes be impaired depending on the phase of reflected light, but this can be avoided by changing the refractive indices of the waveguide layers 6 and 7 of the waveguide regions $C_1$ and $C_2$ between the active filter region $A_1$ and the reflecting end facets through current injection or voltage application so that the phase of the reflected light may be optimum. By the way, if the phase of reflected light could be varied by $2\pi$ at most, then it could be adjusted to an optimum value within this range. Assuming, for example, that the length $l_3$ of the waveguide region $C_1$ or the length $l_3'$ of the waveguide region $C_2$ is 500 μm, a refractive index change of $\Delta n$ to 0.002 will suffice for obtaining the above-mentioned phase variation $2\pi$. This can be done by current injection which needs only to cause a change in carrier density as small as $\Delta N$ to $2 \times 10^{17}$ cm$^{-3}$. In case of utilizing the electrooptic effect by voltage application, such a refractive index change can be achieved by applying a voltage about $\frac{1}{4}$ of a breakdown voltage. The latter method of adjusting the refractive index by voltage application needs only to apply a reverse bias and maintains the semiconductor laser in a low-loss state because it does not involve any carrier injection. Accordingly, such a phase adjustment ensures the oscillation of the semiconductor laser at the single wavelength $\lambda_0$. At the same time, the oscillation line-width can be reduced by selecting the overall length L of the resonator large.

On the other hand, the oscillation wavelength can be changed by changing the refractive index $n_2$ of the light emitting layer 4, in which the $\lambda/4$ shift diffraction grating 5 is provided, in accordance with the density of carriers injected thereinto. Incidentally, the oscillation wavelength can be varied over a range of $\Delta\lambda_0$ to 50 Å by changing the carrier density in the range of $\Delta N$ to $1 \times 10^{18}$ cm$^{-3}$.

Figure 4:
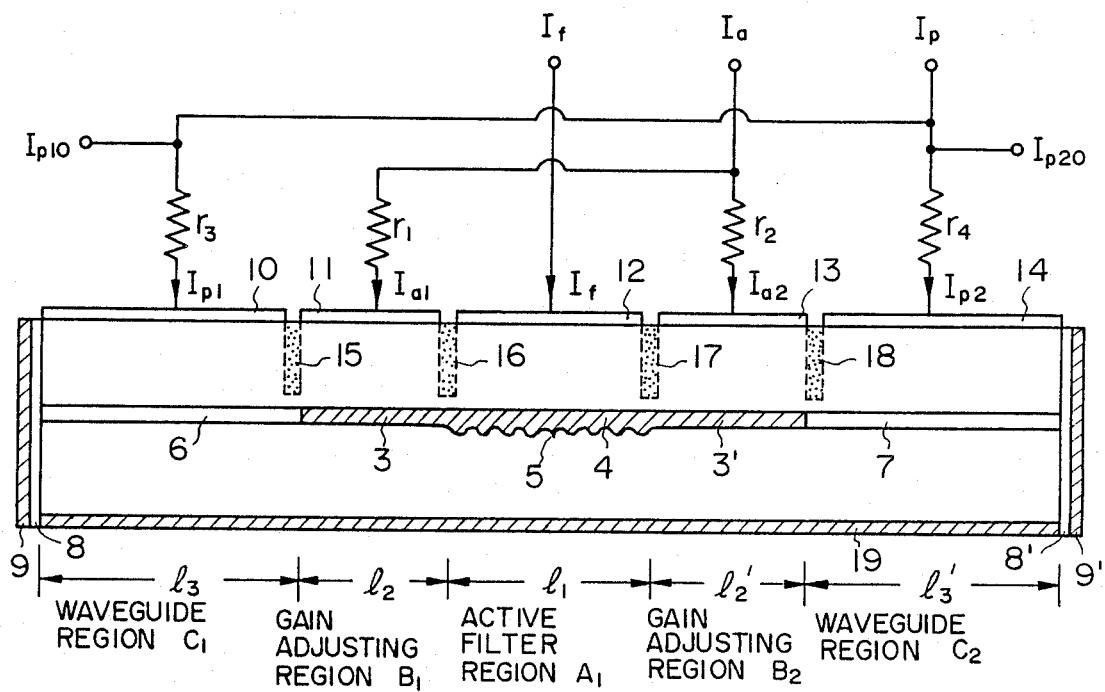
FIG. 4 is a sectional view of a semiconductor laser according to a second embodiment of the present invention.

By the way, the carrier density of the active filter region $A_1$ during oscillation can be changed by adding the gain adjusting regions $B_1$ and $B_2$, adjusting the current injection thereinto to make the overall gain substantially constant, and changing the current injection into the active filter region $A_1$. Since the phase of light reflected by each end facet deviates from an optimum value corresponding to such a change in the oscillation wavelength, the refractive indices of the left and right waveguide regions $C_1$ and $C_2$ must be adjusted to optimum values. By selecting substantially equal the lengths $l_2$ and $l_2'$ of the left and right gain adjusting regions $B_1$ and $B_2$ and the amounts of current injected thereinto $I_2$ and $I_2'$ and the lengths $l_3$ and $l_3'$ of the waveguide regions $C_1$ and $C_2$, phase variations of the reflected light at the left and right sides can be made substantially equal; so that variations in the refractive indices of the waveguide regions $C_1$ and $_{2'}$ necessary for the phase adjustment, can also be made nearly equal to each other. In other words, by disposing the gain adjusting regions $B_1$ and $B_2$ and the waveguide regions $C_1$ and $C_2$ on the both sides of the active filter region $A_1$ substantially symmetrically with respect thereto, substantially the same amount of current or voltage can be injected into or applied to the left- and right-hand regions for optimizing the phase of the reflected light; this permits simplification of the circuit arrangement for driving the semiconductor laser. Even if the device structure is not completely symmetrical, it is possible to distribute proper amounts of current or voltage to the respective regions and achieve optimum phase adjustment by connecting to the respective electrodes resistors whose resistance values are selected in accordance with the lengths of the respective regions in such a manner as to satisfy $I_{a1}/I_{a2} = l_2/l_2' = r_2/r_1$ and $I_{p1} = I_{p2} = l_3/l_3' = r_4/r_3$, where $r_1$ is the resistance value of the resistor connected to the gain adjustment region $B_1$, $I_{a1}$ is a current flowing across the resistor $r_{1'}$, $r_2$ is the resistance value of the resistor connected to the gain adjustment region $B_{2'}$, $I_{a2}$ is a current flowing across the resistor $r_{2'}$, $r_3$ and $r_4$ are resistance values of the resistors connected to the waveguide regions $C_1$ and $C_{2'}$ respectively, and $I_{p1}$ and $I_{p2}$ are currents flowing across the resistors $r_3$, $r_{4'}$ respectively, as shown in FIG. 4. $I_{p10}$ and $I_{p20}$ are currents for initial phase adjustment use.

Figure 5:
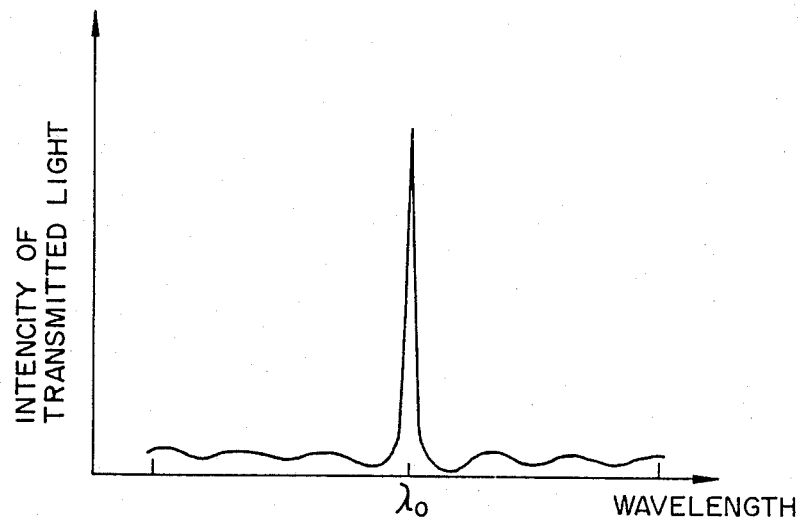
FIG. 5 is graph showing the transmission spectral characteristic of an active filter having a uniform diffraction grating for use in the present invention.

While the embodiment of FIG. 2 is shown to employ a $\lambda/4$ shift diffraction grating as the band-pass filter of the active filter region $A_{1'}$ such a similar excellent band-pass filter characteristic as shown in FIG. 5 can also be obtained by use of a uniform diffraction grating. In this instance also, the phase of reflected light at either side can readily be adjusted as in the above-described embodiment.

Although the above embodiments have been described in connection with the case where the gain adjustment regions $B_1$ and $B_2$ are provided between waveguide regions $C_1$ and $C_{2'}$ the same effect as mentioned above can be produced as long as the gain adjustment regions and the waveguide regions are disposed on the both sides of the active filter region $A_{1'}$ irrespective of positional relationship of the both regions. Since the waveguide layer 6 or 7 is intended primarily for adjusting the phase of reflected light, the purpose could also be achieved by a semiconductor layer which has a composition close to that of the light emitting layer 4, 3 or 3' and a gain.

Figure 6:
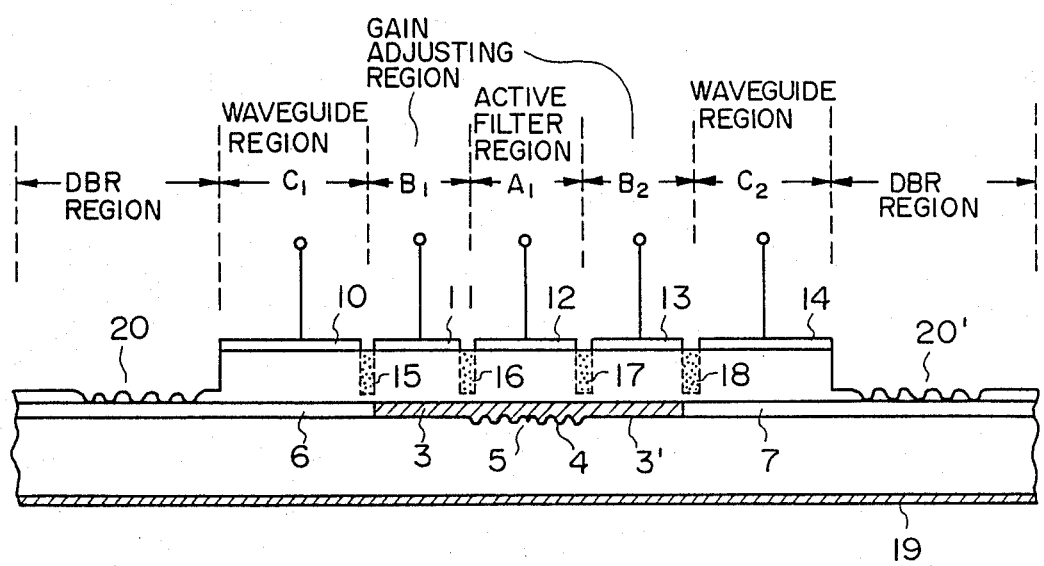
FIG. 6 is a sectional view of a semiconductor laser illustrating another embodiment of the present invention.

While in the above the present invention has been described to employ the direct coupling structure for optically coupling the light emitting layers and the waveguide layers of different compositions, the invention is also applicable to other coupling methods including an LOC (Large Optical Cavity) structure. Moreover, the foregoing embodiments have been described in connection with reflection between a pair of end facets, but distributed Bragg-reflectors (DBR) 20 and 20' may also be used as a pair of reflectors as depicted in FIG. 6, and their use is rather convenient for monolithic integration with other devices because the output light can be obtained through the waveguide. Although no particular reference has been made to a stripe structure for confining light in a transverse direction, all transverse mode optical confinement structures including a buried structure can be used. All compound semiconductor crystals which can be used for the semiconductor laser, such as InGaAsP/InP, AlGaAs/GaAs, InAlGaAs/InP and AlGaAsSb/GaAs, can be employed as semiconductor materials.

As described above, according to the present invention, the light emitting regions $B_1$ and $B_2$ and the waveguide regions $C_1$ and $C_2$ for phase adjustment use are provided symmetrically with respect to the active filter region $A_1$ having a diffraction grating, by which a excellent single wavelength pass-characteristic is obtained, thus making it possible to suppress multi-wavelength oscillation which occurs when the length of the resonator is increased for the purpose of reducing the oscillation line-width. That is to say, a semiconductor can be implemented which is narrow in oscillation line width and stably operates at a single wavelength. Furthermore, the oscillation wavelength can also be changed by changing the refractive indices of the active filter region $A_1$ and the waveguide regions $C_1$ and $C_2$. In this case, since the respective regions are disposed symmetrically, the phase of reflected light can be adjusted to substantially the same extent at the both sides, and the phase adjustment can also be carried out with ease. Accordingly, the present invention is very promising as the light source for coherent transmission and other optical measurements, and hence is of great utility in practical use.

What we claim is:

1. A semiconductor laser comprising: an active filter region including a diffraction grating formed along a first light emitting layer and equipped with a band-pass type filter function; gain adjustment regions for adjusting an optical gain, each having a second light emitting layer formed of a semiconductor which is the same as or different from that of the first light emitting layer; and waveguide regions, each having a waveguide coupled to the active filter region or one of the gain adjustment regions with high efficiency;

in which the gain adjustment regions and the waveguide regions are integrated on a single substrate on both sides of the active filter region substantially symmetrically with respect thereto; a laser resonator is formed by providing a pair of reflecting end facets or reflectors at both ends of the assembly of the gain adjustment regions, the active filter region and the waveguide regions; the gain adjustment regions, the active filter region and the waveguide regions are electrically isolated from one another and are each provided with an electrode; and the oscillation wavelength of the semiconductor laser is changed by changing the refractive indices of the respective regions through voltage application or current injection to the electrodes, thereby producing a narrow-line-width, single-wavelength oscillation output light of a wavelength which agrees with the transmission wavelength of the active filter region dependent on preset refractive indices of the respective regions.

2. A semiconductor laser according to claim 1, in which the respective lengths of the gain adjusting regions are substantially equal to each other.

3. A semiconductor laser according to claim 1, in which the respective lengths of the waveguide regions are substantially equal to each other.

4. A semiconductor laser according to claim 1, in which the respective injection currents to the gain adjusting regions and the waveguide regions are supplied through resistors which have resistances proportional to the lengths of corresponding regions, respectively.

5. A semiconductor laser according to claim 1, in which the diffraction grating employed in the active region is a $\lambda/4$ diffraction grating.

6. A semiconductor laser according to claim 1, in which said pair of end facets comprises distributed Bragg-reflectors.

* * * * *